United States Patent
Gauthier et al.

(10) Patent No.: US 6,914,452 B2
(45) Date of Patent: *Jul. 5, 2005

(54) ADAPTIVE KEEPER SIZING FOR DYNAMIC CIRCUITS BASED ON FUSED PROCESS CORNER DATA

(75) Inventors: Claude R. Gauthier, Cupertino, CA (US); Shaishav A. Desai, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 172 days.

This patent is subject to a terminal disclaimer.

(21) Appl. No.: 10/246,307

(22) Filed: Sep. 17, 2002

(65) Prior Publication Data

US 2004/0051561 A1 Mar. 18, 2004

(51) Int. Cl.⁷ .............................................. H03K 19/096
(52) U.S. Cl. ........................................ 326/98; 326/95
(58) Field of Search ...................... 326/95–98; 365/203

(56) References Cited

U.S. PATENT DOCUMENTS

| | | | | |
|---|---|---|---|---|
| 6,002,292 A | * | 12/1999 | Allen et al. | 327/379 |
| 6,404,235 B1 | * | 6/2002 | Nowka et al. | 326/96 |
| 6,466,056 B1 | * | 10/2002 | Greener | 326/98 |
| 6,549,040 B1 | * | 4/2003 | Alvandpour et al. | 326/98 |
| 6,690,604 B2 | * | 2/2004 | Hsu et al. | 365/189.05 |

* cited by examiner

Primary Examiner—James H. Cho
(74) Attorney, Agent, or Firm—Martine Penilla & Gencarella, LLP (57) ABSTRACT

An invention is provided for an adaptive keeper circuit. The adaptive keeper circuit includes a first keeper transistor having a first terminal in electrical communication with a power supply and a second terminal in electrical communication with an internal dynamic node. In addition, a second keeper transistor is included that is configured in parallel to the first keeper transistor. The second keeper transistor also has a first terminal in electrical communication with the power supply. The second keeper transistor can be added to the first keeper transistor using a feedback bit line, which is configured to control current flow between the second keeper transistor and the internal dynamic node based on a state of the feedback bit line. The state of the feedback bit line is based on a process corner characteristic of the die. Additional keeper transistors and corresponding feedback bit lines can be added to the keeper circuit to increase flexibility.

12 Claims, 5 Drawing Sheets

ADAPTIVE KEEPER SIZING FOR DYNAMIC CIRCUITS BASED ON FUSED PROCESS CORNER DATA

CROSS REFERENCE TO RELATED APPLICATIONS

This application is related to U.S. patent application Ser. No. 10/246,336, filed Sep. 17, 2002, and entitled "Process Monitor Based Keeper Scheme For Dynamic Circuits," which is incorporated herein by reference.

BACKGROUND OF THE INVENTION

1. Field of the Invention

This invention relates generally to keeper circuits, and more particularly to adaptive keeper transistor sizing for dynamic circuits based on global process corner data.

2. Description of the Related Art

Conventionally, keeper circuits have been utilized in dynamic circuits to prevent leaking at an internal dynamic node. For example, dynamic wide OR circuits commonly utilized in large register files often use keeper circuits to prevent unintentional discharging of the internal dynamic node, as illustrated in FIG. 1.

Figure 1:
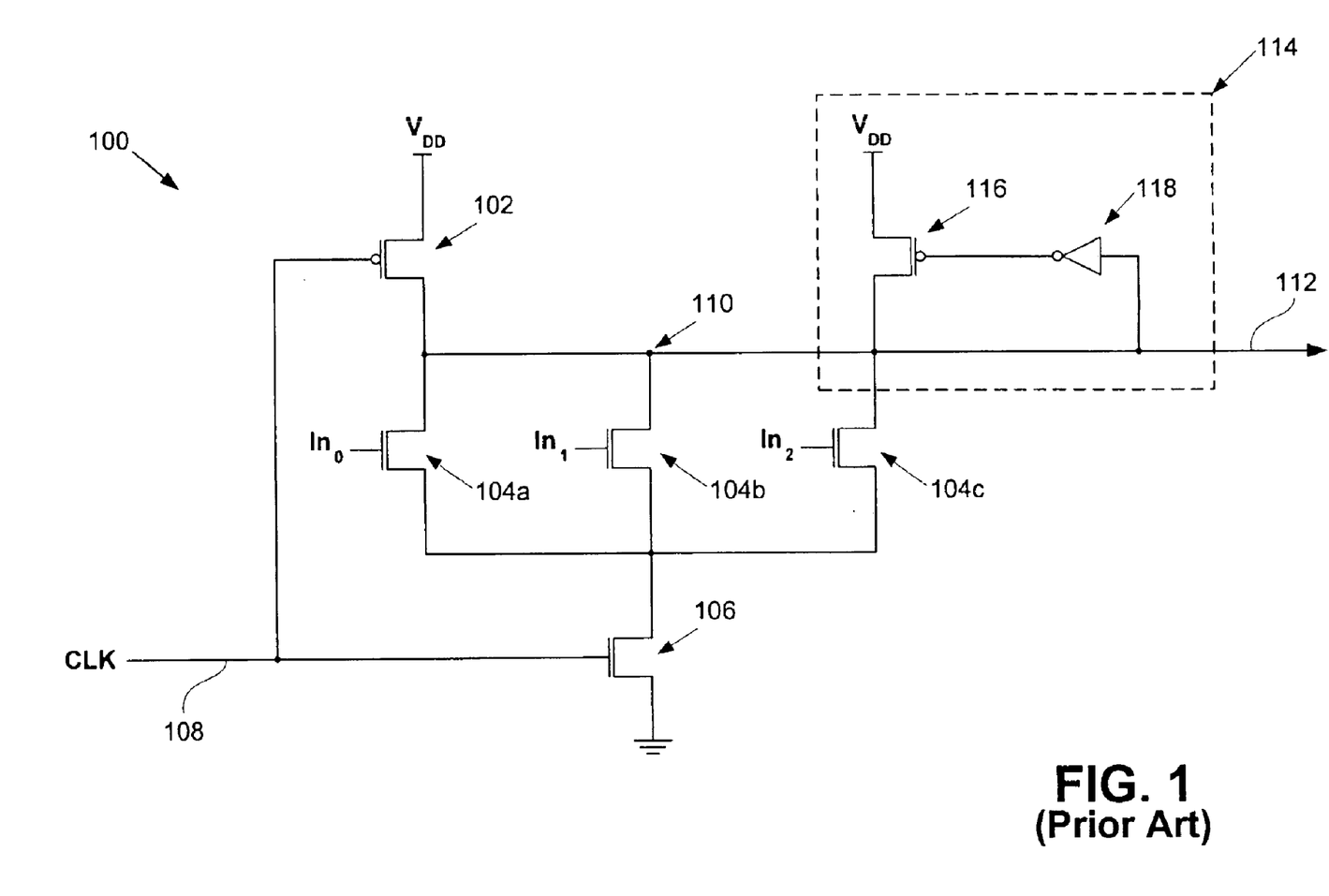
FIG. 1 is a schematic diagram showing a conventional dynamic wide OR circuit.

FIG. 1 is a schematic diagram showing a conventional dynamic wide OR circuit 100. The dynamic wide OR circuit 100 includes a precharge p-channel transistor 102, having a first terminal coupled to $V_{DD}$, a second terminal coupled to an internal dynamic node 110, and a gate coupled to a clock signal 108. In addition, a plurality of evaluation transistors 104a–104c is included in the dynamic wide OR circuit 100. Each evaluation transistor 104a–104c includes a first terminal coupled to the internal dynamic node 110 and a second terminal coupled to a first terminal of transistor 106. In addition, the gate of each evaluation transistor 104a–104c is coupled to an input $In_0$, $In_1$, and $In_2$, respectively. A second terminal of transistor 106 is coupled to ground and the gate of transistor 106 is coupled to the clock signal 108. Although FIG. 1 illustrates an OR circuit, it should be noted that the evaluation transistors can be configured to form any logic circuit as desired by the circuit developer.

The conventional dynamic wide OR circuit 100 operates in two phases, namely, a precharge phase and an evaluation phase. During the precharge phase the clock signal 108 is LOW. Hence, transistor 106 is OFF and the precharge transistor 102 is ON, which allows current to flow from $V_{DD}$ to the internal dynamic node 110. As a result, a precharge is provided to the internal dynamic node 110, which goes HIGH. Because transistor 106 is OFF, the internal dynamic node 110 stays high during the precharge phase regardless of the state of the evaluation transistors 104a–104c.

During the evaluation phase the clock signal 108 is HIGH. Hence, transistor 106 is ON and the precharge transistor 102 is OFF, which allows current to flow from the internal dynamic node 110 to ground based on the state of the evaluation transistors 104a–104c. The state of each evaluation transistor 104a–104c depends on the state of the input $In_0$, $In_1$, and $In_2$ coupled to the gate of the particular evaluation transistor 104a–104c. As can be seen in the example of FIG. 1, when the input $In_0$, $In_1$, and $In_2$ of any evaluation transistor 104a–104c is HIGH, the evaluation transistor 104a–104c turns ON and allows current to flow from the internal dynamic node 110 to ground through transistor 106. As a result, the output 112 will be LOW.

However, when all the inputs $In_0$, $In_1$, and $In_2$ of the evaluation transistors 104a–104c are LOW, all the evaluation transistors 104a–104c are OFF and the internal dynamic node 110 is allowed to stay HIGH, resulting in a HIGH at the output 112. Unfortunately, the evaluation transistors 104a–104c leak. That is, each evaluation transistor 104a–104c allows a small amount of leakage current to flow to ground through transistor 106 when the evaluation transistor 104a–104c is OFF. Thus, when all the inputs $In_0$, $In_1$, and $In_2$ of the evaluation transistors 104a–104c are LOW, a leakage current is still allowed to flow from the internal dynamic node 110 to ground though transistor 106. Thus, the voltage on the internal dynamic node 110 falls over time.

To combat the leakage current, keeper circuits 114 are utilized. The conventional keeper circuit 114 includes an inverter 118 having an input coupled to the internal dynamic node 110 and an output coupled to the gate of a keeper transistor 116. The keeper transistor 116 includes a first terminal coupled to $V_{DD}$ and a second terminal coupled to the internal dynamic node 110.

The keeper circuit 114 is primarily utilized to address leakage by keeping the internal dynamic node 110 HIGH when all the evaluation transistors 104a–104c are OFF. In particular, when the internal dynamic node 110 is HIGH, the input of the inverter 118 is HIGH, resulting in a LOW at the output of the inverter 118. The LOW at the output of the inverter 118 turns ON the keeper transistor 116, which allows current to flow into the internal dynamic node 110 from $V_{DD}$.

On the other hand, when the internal dynamic node is LOW, because of an evaluation transistor 104a–104c being ON, the keeper circuit 114 turns OFF. Specifically, when the internal dynamic node 110 is LOW, the input of the inverter 118 is LOW, resulting in a HIGH at the output of the inverter 118. The HIGH at the output of the inverter 118 turns OFF the keeper transistor 116, which prevents current from flowing into the internal dynamic node 110 from $V_{DD}$.

The leakage current is proportional to the size and number of evaluation devices 104a–104c present in the circuit. Hence, the size of the keeper transistor 116 is selected based on the size and number of evaluation devices 104a–104c present in the circuit, generally, at the worst case for leakage for expected process, voltage, and temperature. It should be noted that the keeper transistor 116 cannot be made arbitrarily large because the keeper transistor circuit 114 will adversely affect evaluation performance if the keeper transistor 116 is too large. In particular, if the keeper transistor 116 is too large, the keeper transistor 116 will try to keep the internal dynamic node 110 HIGH when the evaluation transistors attempt to discharge the internal dynamic node 110. As a result, the evaluation time can be increased and/or the value of the precharged internal dynamic node 110 may not change when an evaluation transistor is ON.

Unfortunately, this also imposes a limit on the number of evaluation devices that can be included in a conventional dynamic circuit. Increasing the number of evaluation transistors in a dynamic circuit increases the amount of leakage current proportionally. As a result, larger keeper transistors 116 are required. However, at some point, the size of keeper transistor 116 becomes too large for a single evaluation transistor 1041–104c to overcome and pull the internal dynamic node 110 LOW. This point becomes the limit to the number of evaluation devices that can be included in the dynamic circuit. Thus, the size of the keeper transistor is conventionally selected based on this limit and the worst-case leakage corner. It is desirable to remove this constraint from the design.

In view of the foregoing, there is a need for a keeper circuit design that allows the effective size of the keeper transistor to be changed based on the individual properties of the chip. The keeper circuits should adjust the effective keeper transistor size based on the requirements of the overall circuit, such as electrical characteristics of the transistors utilized in the circuit. As a result, larger dynamic circuits could be utilized, potentially improving the speed of the microprocessor itself.

SUMMARY OF THE INVENTION

Broadly speaking, the present invention fills these needs by providing adaptive keeper transistor sizing in dynamic circuits based on fused process corner data. In one embodiment, an adaptive keeper circuit is disclosed. The adaptive keeper circuit includes a first keeper transistor having a first terminal in electrical communication with a power supply and a second terminal in electrical communication with an internal dynamic node. In addition, a second keeper transistor is included that is configured in parallel to the first keeper transistor. The second keeper transistor also has a first terminal in electrical communication with the power supply. The second keeper transistor can be added to the first keeper transistor using a feedback bit line, which is configured to control current flow between the second keeper transistor and the internal dynamic node based on a state of the feedback bit line. The state of the feedback bit line is based on a process corner characteristic of the die. Additional keeper transistors and corresponding feedback bit lines can be added to the keeper circuit to increase flexibility.

In an additional embodiment, a semiconductor die having adaptive keeper logic is disclosed. The semiconductor die includes a plurality of dynamic circuits, each including an adaptive keeper circuit that is capable of being adjusted based on a bit code. A process corner databank is also included that includes process corner data indicating a process corner of the semiconductor die. In communication with both the process corner databank and the plurality of dynamic circuits is a test processor unit. The test processor unit is capable of obtaining process corner data from the process corner databank and can further provide a bit code based on the process corner data to the plurality of dynamic circuits. In this manner, the adaptive keeper circuits of the dynamic circuits can be adjusted based on the process corner data.

A method for optimizing a keeper circuit for use in a dynamic circuit is disclosed in a further embodiment of the present invention. The method includes obtaining process corner data for a die from a databank present on the die. The process corner data then is translated into a bit code, which indicates a process corner of the die. In this manner, particular secondary keeper transistors can be selected to add to the first transistor based on the bit code. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for adaptive keeper transistor sizing in dynamic circuits based on fused process corner data. Broadly speaking, embodiments of the present invention adjust the effective keeper transistor size by enabling additional keeper transistors based on the characteristics of the particular dynamic circuit (i.e., Process corner). As described in greater detail below, these characteristics are determined by examining data electrically programmed onto the die. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

As mentioned above, embodiments of the present invention adjust the effective size of the keeper transistor according to the process conditions of the die. For example, at faster process corners the leakage current of the pull down transistors is high. As a result, embodiments of the present invention increase the strength of the keeper transistor to prevent unintentional discharging of the internal dynamic node. However, at nominal process corners, the leakage current of the pull down transistors generally is lower than at faster process corners. Hence, the keeper size is reduced to allow faster operation at normal conditions. In this manner, embodiments of the present invention allow wider and faster dynamic OR circuits, thereby enabling faster microprocessor operation.

Figure 2:
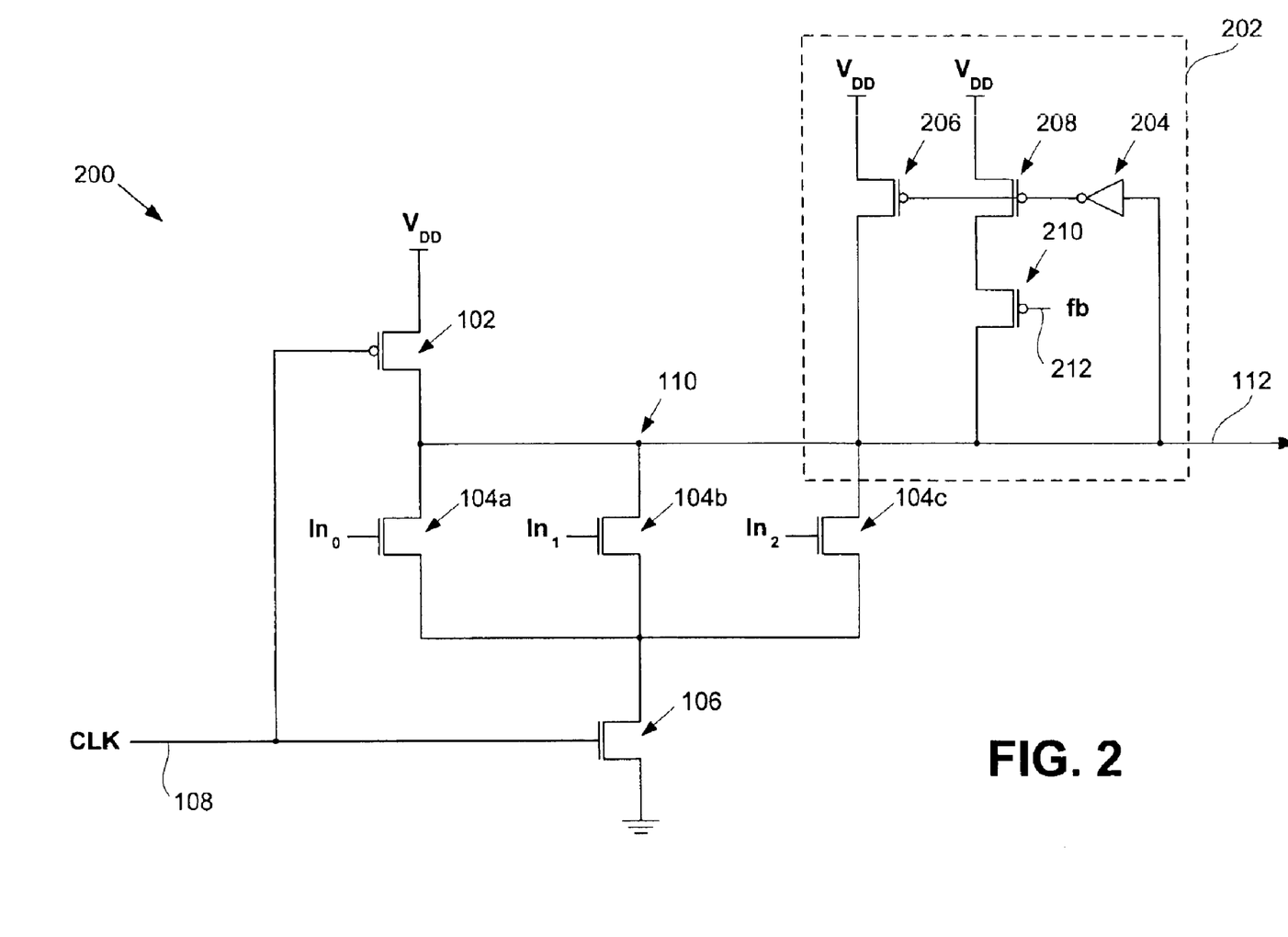
FIG. 2 is a schematic diagram showing an exemplary dynamic wide OR circuit, in accordance with an embodiment of the present invention.

FIG. 2 is a schematic diagram showing an exemplary dynamic wide OR circuit 200, in accordance with an embodiment of the present invention. The dynamic wide OR circuit 200 includes a precharge p-channel transistor 102, having a first terminal coupled to $V_{DD}$, a second terminal coupled to an internal dynamic node 110, and a gate coupled to a clock signal 108. In addition, a plurality of evaluation transistors 104a–104c is included. Each evaluation transistor 104a–104c includes a first terminal coupled to the internal dynamic node 110 and a second terminal coupled to a first terminal of transistor 106. In addition, the gate of each evaluation transistor 104a–104c is coupled to an input $In_0$, $In_1$, and $In_2$, respectively. A second terminal of transistor 106 is coupled to ground and the gate of transistor 106 is coupled to the clock signal 108. Although FIG. 2 illustrates an OR circuit, it should be noted that the evaluation transistors can be configured to form any logic circuit as desired by the circuit developer.

For completeness, the operation of the dynamic OR circuit will be described. As described above, the dynamic wide OR circuit 200 operates using a precharge phase and an evaluation phase. During the precharge phase the clock signal 108 is LOW, which turns transistor 106 OFF and turns the precharge transistor 102 ON, allowing current to flow from $V_{DD}$ to the internal dynamic node 110. As a result, a precharge is provided to the internal dynamic node 110, which goes HIGH. Because transistor 106 is OFF, the internal dynamic node 110 stays high during the precharge phase regardless of the state of the evaluation transistors 104a–104c.

During the evaluation phase the clock signal 108 is HIGH. Hence, transistor 106 is ON and the precharge transistor 102 is OFF, which allows current to flow from the internal dynamic node 110 to ground based on the state of the evaluation transistors 104a–104c. The state of each evaluation transistor 104a–104c depends on the state of the input $In_0$, $In_1$, and $In_2$ coupled to the gate of the particular evaluation transistor 104a–104c. As can be seen in the example of FIG. 2, when the input $In_0$, $In_1$, and $In_2$ of any evaluation transistor 104a–104c is HIGH, the evaluation transistor 104a–104c turns ON and allows current to flow from the internal dynamic node 110 to ground through transistor 106. As a result, the output 112 will be LOW.

However, when all the inputs $In_0$, $In_1$, and $In_2$ of the evaluation transistors 104a–104c are LOW, all the evaluation transistors 104a–104c are OFF and the internal dynamic node 110 is allowed to stay HIGH, resulting in a HIGH at the output 112. As mentioned above, the evaluation transistors 104a–104c leak. Thus, when all the inputs $In_0$, $In_1$, and $In_2$ of the evaluation transistors 104a–104c are LOW, a leakage current is still allowed to flow from the internal dynamic node 110 to ground though transistor 106.

Embodiments of the present invention utilize an adaptive keeper circuit 202 to compensate for the leakage current through the evaluation transistors 104a–104c. The adaptive keeper circuit 202 includes an inverter 204 having an input coupled to the internal dynamic node 110 and an output coupled to the gate of a first keeper transistor 206. A first terminal of the first keeper transistor 206 is coupled to $V_{DD}$ and a second terminal is coupled to the internal dynamic node 110. In addition, the output of the inverter 204 is coupled to the gate of a second keeper transistor 208, which includes a first terminal coupled to $V_{DD}$ and a second terminal coupled to a first terminal of a feedback transistor 210. The second terminal of the feedback transistor 210 is coupled to the internal dynamic node 110, and the gate of the feedback transistor 210 is coupled to a feedback bit 212.

Embodiments of the present invention vary the effective size of the keeper transistor by adding or subtracting the second keeper transistor 208 to the first keeper transistor 206. Control is provided by the feedback bit 212, which is coupled to the gate of the feedback transistor 210. For example, during operation at a normal process corner, the feedback bit 212 is HIGH, which turns the feedback transistor 210 OFF. When the feedback transistor 210 is OFF, the path from the second keeper transistor 208 to the internal dynamic node 110 is disabled. As a result, the second keeper transistor 208 is not added to the first keeper transistor 206. However, during operation at a fast process corner, the feedback bit 212 is LOW, which turns the feedback transistor 210 ON. Consequently, current is allowed to flow from the second keeper transistor 208 to the internal dynamic node 110. As a result, the second keeper transistor 208 is added to the first keeper transistor 206, effectively increasing the size of the keeper transistor.

Thus, the keeper circuit 202 can be used to keep the internal dynamic node 110 HIGH when all the evaluation transistors 104a–104c are OFF. When the internal dynamic node 110 is HIGH, the input of the inverter 204 is HIGH, resulting in a LOW at the output of the inverter 204. The LOW at the output of the inverter 204 turns ON both the first keeper transistor 206 and the second keeper transistor 208. Consequently, the first keeper transistor 206 allows current to flow into the internal dynamic node 110 from $V_{DD}$. In addition, depending on the state of the feedback transistor 210, the second keeper transistor 208 may allow additional current to flow into the internal dynamic node 110 from $V_{DD}$. That is, when the feedback transistor 210 is ON, the second keeper transistor allows additional current is allowed to the internal dynamic node 110. However, when the feedback transistor 210 is OFF, the path from the second keeper transistor 208 to the internal dynamic node 110 is disabled, and current from the second keeper transistor 208 is not added to the internal dynamic node 110.

When the internal dynamic node is LOW, for example because of an evaluation transistor 104a–104c being ON, the keeper circuit 202 turns OFF. Specifically, when the internal dynamic node 110 is LOW, the input of the inverter 204 is LOW, resulting in a HIGH at the output of the inverter 204. The HIGH at the output of the inverter 204 turns OFF both the keeper transistors 206 and 208, which prevents current from flowing into the internal dynamic node 110 from $V_{DD}$, regardless of the state of the feedback transistor 210.

Figure 3:
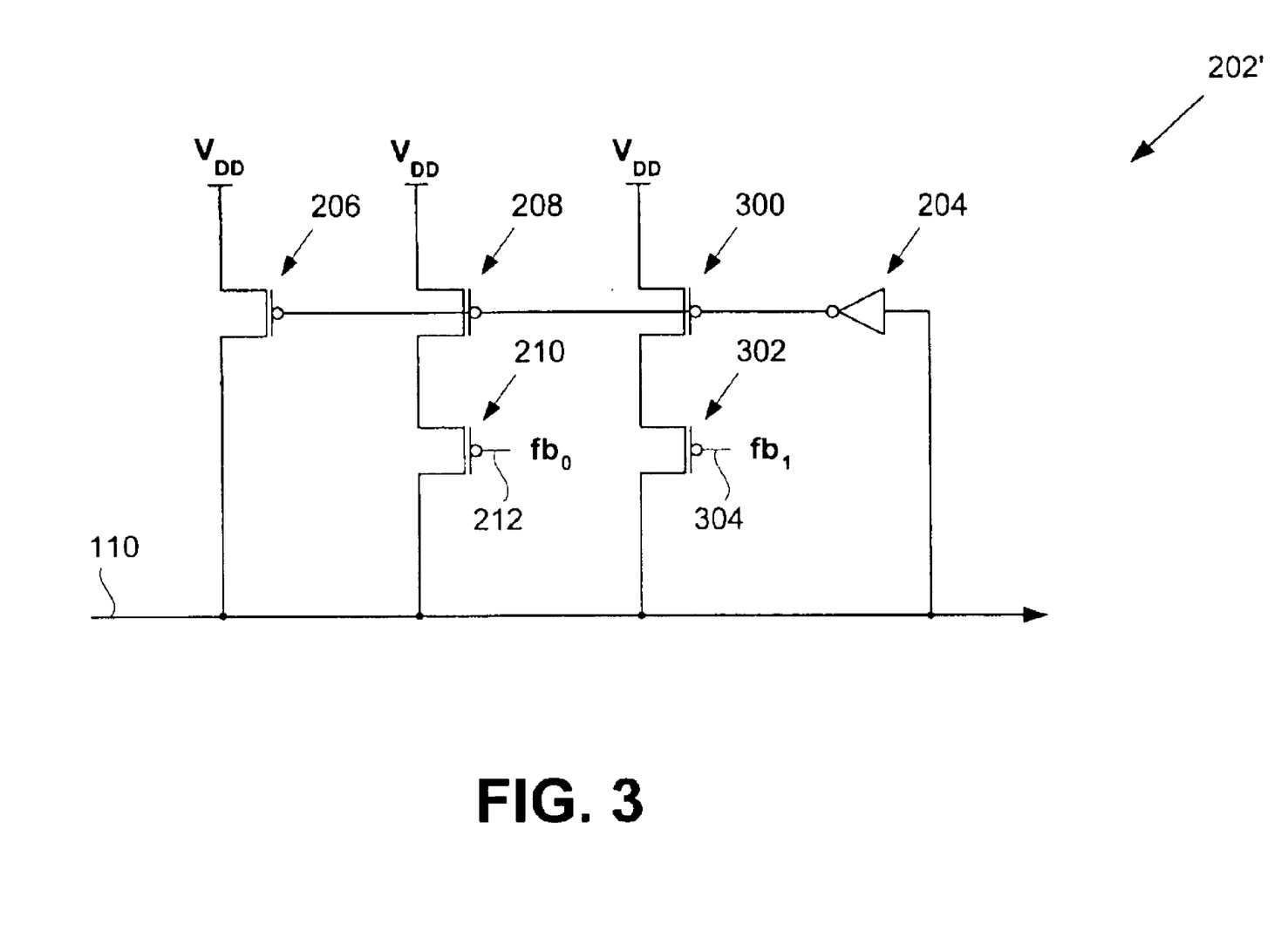
FIG. 3 is a schematic diagram showing a keeper circuit having three keeper transistor paths, in accordance with an embodiment of the present invention.

Additional keeper transistors can be utilized in the keeper circuit 202 of the embodiments of the present invention to provide increased keeper size variation. For example, FIG. 3 is a schematic diagram showing a keeper circuit 202' having three keeper transistor paths, in accordance with an embodiment of the present invention. In this case, control is provided by two feedback bits $fb_0$ 212 and $fb_1$ 304, each coupled to the gate of feedback transistor 210 and feedback transistor 302, respectively.

The additional keeper transistor paths operate in a manner similar to that described with respect to FIG. 2. Specifically, when the feedback bit $fb_0$ 212 is HIGH, feedback transistor 210 OFF, which disables the path from the second keeper transistor 208 to the internal dynamic node 110. Similarly, when the feedback bit $fb_1$ 304 is HIGH, feedback transistor 302 OFF, which disables the path from the third keeper transistor 300 to the internal dynamic node 110. As a result, neither the second keeper transistor 208 nor the third keeper transistor 300 is added to the first keeper transistor 206.

When the feedback bit $fb_0$ 212 is LOW, feedback transistor 210 ON, which allows additional current to flow from the second keeper transistor 208 to the internal dynamic node 110. Similarly, when the feedback bit $fb_1$ 304 is LOW, feedback transistor 302 ON, which also allows additional current to flow from the second keeper transistor 208 to the internal dynamic node 110. As a result, both the second keeper transistor 208 and the third keeper transistor 302 are added to the first keeper transistor 206, thus effectively increasing the size of the keeper transistor. As can be appreciated, various combinations of keeper transistors 208 and 300 can be added to the first keeper transistor 206, depending on the states of the feedback bits $fb_0$ 212 and $fb_1$ 304. For example, when feedback bit $fb_0$ 212 is HIGH and $fb_1$ 304 is LOW, the third keeper transistor 300 will be added to the first keeper transistor 206, while the second keeper transistor 208 will not be added to the first keeper transistor 206.

As above, when the internal dynamic node 110 is HIGH, the input of the inverter 204 is HIGH, resulting in a LOW at the output of the inverter 204. The LOW at the output of the inverter 204 turns ON all the keeper transistors 206, 208, and 300. Consequently, the first keeper transistor 206 allows current to flow into the internal dynamic node 110 from $V_{DD}$ and, depending on the state of the feedback bits $fb_0$ 212 and $fb_1$ 304, additional current may be allowed to flow into the internal dynamic node 110 from $V_{DD}$, as described above.

When the internal dynamic node is LOW, the keeper circuit 202' turns OFF. That is, when the internal dynamic node 110 is LOW, the input of the inverter 204 is LOW, resulting in a HIGH at the output of the inverter 204. The HIGH at the output of the inverter 204 turns OFF all the keeper transistors 206, 208, and 300, which prevents current from flowing into the internal dynamic node 110 from $V_{DD}$, regardless of the state of the feedback bits $fb_0$ 212 and $fb_1$ 304.

As discussed above, embodiments of the present invention can be utilized with as many additional keeper transistors as required by the particular circuit configuration. Moreover, each keeper transistor can itself be different in size to other keeper transistors. For example, the keeper transistors can be weighted in a binary fashion such that the second keeper transistor 208 is twice as large as the first keeper transistor 206, and the third keeper transistor 300 can be twice as large as the second keeper transistor 206. This also applies to the feedback transistors, which can be scaled proportionately to the corresponding keeper transistor. In this manner, each keeper transistor path, which includes a keeper transistor and the feedback transistor coupled to it, can be scaled to obtain a greater number of keeper size combinations using fewer feedback bits.

Figure 4:
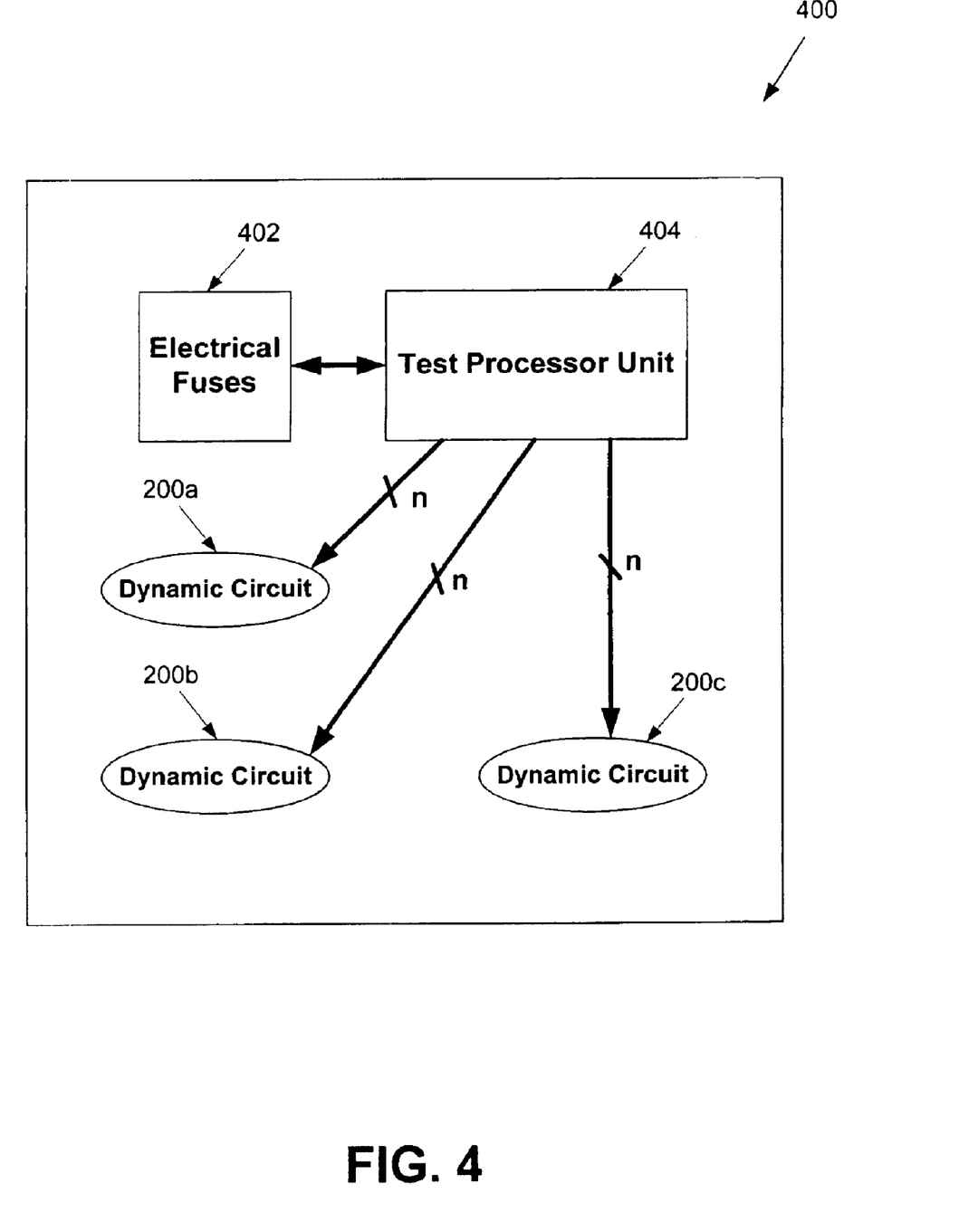
FIG. 4 is a block diagram showing a die having adaptive keeper sizing capabilities, in accordance with an embodiment of the present invention.

Embodiments of the present invention vary the effective size of the keeper transistor based on the process corner of the die. This is accomplished by changing the state of the feedback bits based on the process corner of the die. FIG. 4 is a block diagram showing a die 400 having adaptive keeper sizing capabilities, in accordance with an embodiment of the present invention. As shown in FIG. 4, the die 400 includes an electrical fuse bank 402 and a test processor unit 404 in electrical communication with the electrical fuse bank 402. The test processor unit 404 is also in communication with a plurality of dynamic circuits 200a–200c, each having adaptive keeper circuits. Although three dynamic circuits 200a–200c are illustrated in FIG. 4, it should be noted that any number of dynamic circuits can be included on the die 400 and placed in communication with the test processor unit 400.

Broadly speaking, the test processor unit 400 of the embodiments of the present invention determines bit codes for the feedback bits of the die 400, and provides these codes to each dynamic circuit 200a–200c requiring feedback bit data. The embodiments of the present invention utilize process corner data provided by chip manufactures to scale the keeper circuit sizes for dynamic circuits on the die 400. In particular, during chip manufacturing, globally occurring process variation is determined for each die 400. Generally, this is performed by the chip manufacturer and is programmed on the die 400 using the electrical fuse bank 402.

The electrical fuse bank 402 comprises a plurality of fuses, which can be blown in a particular configuration to indicate the process corner in which the particular die 400 tested. For example, if the die 400 is tested and found to be in a fast fast (ff) process corner, the ff process corner can be indicated by blowing a particular fuse configuration in the electrical fuse bank 402. It should be noted that the actual fuses utilized in the electrical fuse bank 402 can comprise any type of fuse such as flash, EPROM, or any other type of fuse. As mentioned above, generally the chip manufacturer programs the process corner data onto the die 400. However, it should be noted that the process corner data can be tested and programmed onto the die 400 at anytime prior to use.

In operation, the test processor unit 404 reads the configuration of the fuses in the electrical fuse bank 402 to determine the process corner for particular die 400. Once read, the test processor unit 404 translates the fuse information into a bit code that indicates the process corner of the die 400. Generally, the translation can be performed utilizing a lookup table that cross-indexes fuse data with corresponding bit codes. For example, if a particular set of dies are classified into three process corners such as fast fast (ff), slow fast (sf), and slow slow (ss), an exemplary bit code may be:

| | |
|---|---|
| ff | 00 |
| sf | 01 |
| ss | 10 |

Hence, if the electrical fuse bank 402 of the die 400 included a fuse configuration that indicated a sf process corner, the test processor unit 404 will, in this example, translate the sf process corner data into the bit code "01." The test processor unit 404 then distributes the translated bit code to the plurality of dynamic circuits 200a–200c throughout the die 400. Generally, each bit in the bit code corresponds to a particular feedback bit. For example, the above bit code "01" can indicate that feedback bit $fb_0$ is HIGH and feedback bit $fb_1$ is LOW, in FIG. 2. In this manner, each dynamic circuit 200a–200c of the die 400 will have its keeper transistor sized appropriately for the process corner of the die 400.

Figure 5:
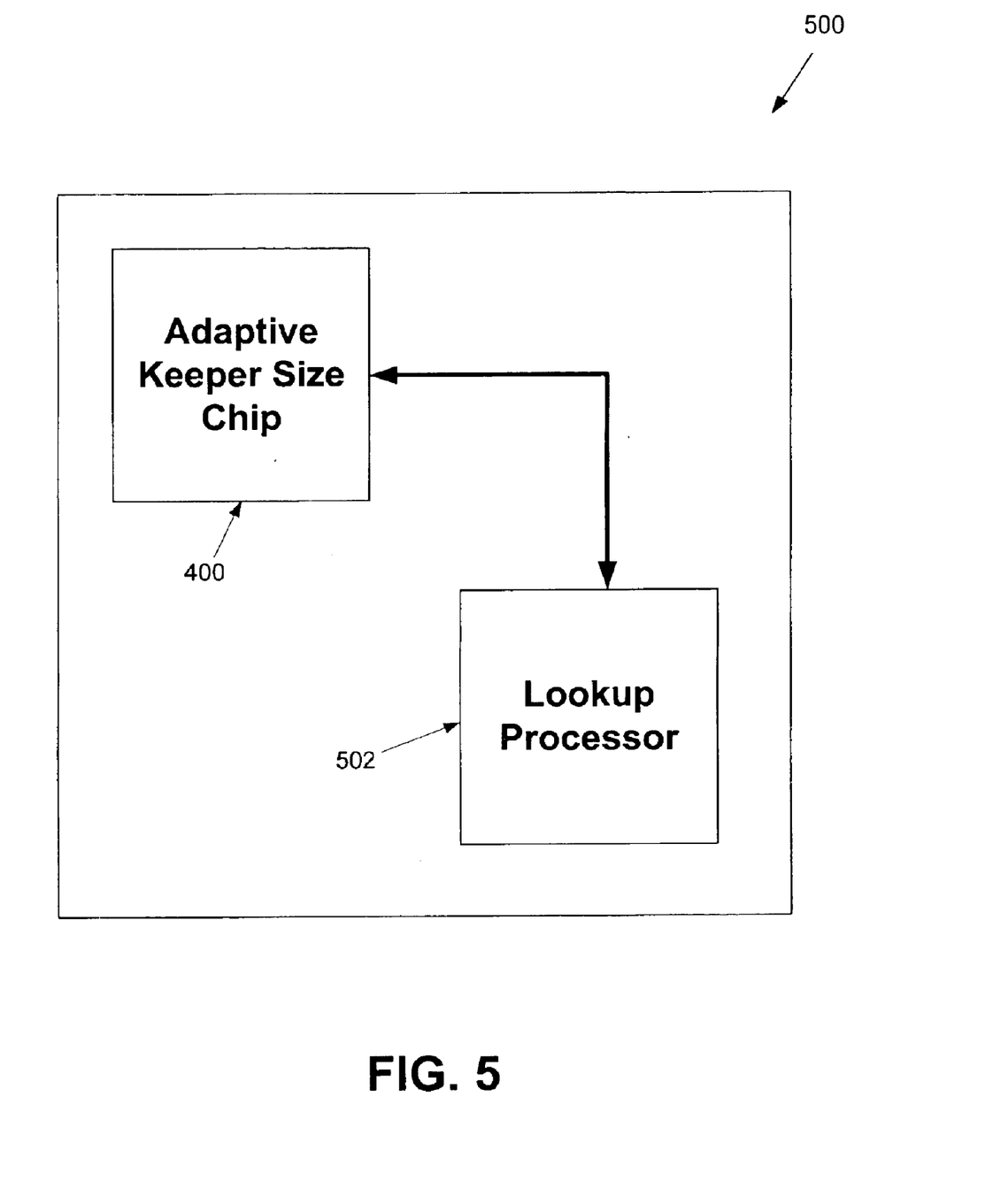
FIG. 5 is a block diagram showing a system utilizing off chip bit code lookup for adaptive keeper sizing, in accordance with an embodiment of the present invention.

In addition to being stored on the die 400, as illustrated in FIG. 4, the bit code mapping can be obtained off chip. FIG. 5 is a block diagram showing a system 500 utilizing off chip bit code lookup for adaptive keeper sizing, in accordance with an embodiment of the present invention. As shown in FIG. 5, the system 500 includes an adaptive keeper size chip 400, as discussed above with respect to FIG. 4. In addition, the adaptive keeper size chip 400 is in communication with a lookup processor 502. The lookup processor 502 can be any processor that is capable of translating the fuse data into bit codes for use in the adaptive keeper size chip 400. For example, the lookup processor 502 can be a central processing unit (CPU) for the system 500, or a dedicated lookup processor.

In the system 500, the test processor unit of the adaptive keeper size chip 400 uses the lookup processor 502 to translate the fuse configuration data into bit codes for use in the dynamic circuits of the adaptive keeper size chip 400. In particular, once the test processor unit of the adaptive keeper size chip 400 reads the fuse data from the electrical fuse bank, the test processor unit sends a request to the lookup processor 502. The request generally includes the fuse data, and indicates the test processor unit requires the corresponding bit code for the fuse data. In response, the lookup processor 502 translates the fuse data into a corresponding bit code, for example, by performing a lookup operation, as described above. Thereafter, the lookup processor 502 transmits the requested bit code to the test processor unit of the adaptive keeper size chip 400. Since the translation is performed off chip using the lookup processor 502, the translation process can be software based. In this manner, a user can easily program the translation operation that the lookup processor 502 will perform, thus giving the user increased flexibility.

Embodiments of the present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor die having adaptive keeper logic, comprising:
    a plurality of dynamic circuits, each dynamic circuit including an adaptive keeper circuit capable of being adjusted based on a bit code;
    a process corner databank having process corner data that indicates a process corner of the semiconductor die; and
    a test processor unit in communication with the process corner databank and the plurality of dynamic circuits, the test processor unit being capable of obtaining process corner data from the process corner databank, the test processor unit further being capable of providing a bit code based on the process corner data to the plurality of dynamic circuits.

2. A semiconductor die as recited in claim 1, wherein the process corner databank is a fuse bank having a plurality of fuses, wherein a configuration of the plurality of fuses indicates a process corner of the semiconductor die.

3. A semiconductor die as recited in claim 2, wherein each adaptive keeper circuit includes at least one feedback bit line that receives a portion of the bit code, the feedback bit line controlling current flow to an internal dynamic node.

4. A semiconductor die as recited in claim 3, wherein each adaptive keeper circuit further includes a first keeper transistor and at least one secondary keeper transistor in parallel with the first keeper transistor, the first keeper transistor and the secondary keeper transistor being in electrical communication with a power supply, the first keeper transistor further being in electrical communication with an internal dynamic node.

5. A semiconductor die as recited in claim 4, wherein each adaptive keeper circuit further includes at least one feedback transistor in electrical communication with the at least one secondary transistor, the feedback transistor controlling current flow between the secondary transistor and the internal dynamic node.

6. A semiconductor die as recited in claim 5, wherein the at least one feedback transistor controls current flow between the secondary transistor and the internal dynamic node based on a state of the feedback bit line.

7. A semiconductor die as recited in claim 1, wherein the test processor unit translates the process corner data into the bit code using a lookup function.

8. A semiconductor die as recited in claim 1, further comprising a lookup processor that receives process corner data from the test processor unit and provides a corresponding bit code to the test processor unit based on the received process corner data.

9. A method for optimizing a keeper circuit for use in a dynamic circuit, comprising the operations of:
    obtaining process corner data for a die from a databank present on the die;
    translating the process corner data into a bit code, the bit code indicating a process corner of the die; and
    adding particular secondary keeper transistors to a first keeper transistor, the particular secondary keeper transistors being selected using the bit code.

10. A method as recited in claim 9, wherein secondary keeper transistors are added to the first keeper transistor utilizing corresponding feedback transistors, each feedback transistor having a gate coupled to a bit of the bit code.

11. A method as recited in claim 10, wherein the databank is an electrical fuse bank comprising a plurality of fuses, the process corner data being represented by a particular fuse configuration of the plurality of fuses.

12. A method as recited in claim 11, wherein each secondary keeper transistor provides current to an internal dynamic node based on a state of the bit code.

* * * * *